United States Patent
Mari Curbelo et al.

(10) Patent No.: US 10,425,001 B2
(45) Date of Patent: Sep. 24, 2019

(54) TAMPER-RESISTANT POWER SWITCH APPARATUS FOR A POWER CONVERTER AND POWER CONVERTER

(71) Applicant: GE Energy Power Conversion Technology Limited, Rugby, Warwickshire (GB)

(72) Inventors: Alvaro Jorge Mari Curbelo, Oberschleissheim (DE); Christof Sihler, Karlsruhe (DE); Miguel Garcia Clemente, Karlsruhe (DE); Thomas Alois Zoels, Hebertshausen (DE)

(73) Assignee: GE Energy Power Conversion Technology Limited, Warwickshire (GB)

( * ) Notice: Subject to any disclaimer, the term of this patent is extended or adjusted under 35 U.S.C. 154(b) by 0 days.

(21) Appl. No.: 15/773,810

(22) PCT Filed: Oct. 31, 2016

(86) PCT No.: PCT/GB2016/053370
§ 371 (c)(1),
(2) Date: May 4, 2018

(87) PCT Pub. No.: WO2017/077278
PCT Pub. Date: May 11, 2017

(65) Prior Publication Data
US 2018/0337587 A1  Nov. 22, 2018

(30) Foreign Application Priority Data
Nov. 5, 2015 (EP) ..................... 15193257

(51) Int. Cl.
*H02M 1/08* (2006.01)
*H02M 1/32* (2007.01)
(Continued)

(52) U.S. Cl.
CPC ............. *H02M 1/08* (2013.01); *H02M 1/32* (2013.01); *H02M 5/293* (2013.01); *H03K 17/28* (2013.01); *H02M 2005/2932* (2013.01)

(58) Field of Classification Search
CPC ............ H02M 1/08; H02M 5/40; H02M 5/42; H02M 5/453; H02M 5/458; H02M 5/45;
(Continued)

(56) References Cited

U.S. PATENT DOCUMENTS

| 5,912,813 A | * | 6/1999 | Kerkman | .......... H02M 7/53875 |
| | | | | 318/811 |
| 5,990,658 A | * | 11/1999 | Kerkman | ................ H02P 27/08 |
| | | | | 318/434 |

(Continued)

FOREIGN PATENT DOCUMENTS

WO   2012/035474 A1   3/2012

OTHER PUBLICATIONS

Extended European Search Report and Opinion issued in connection with corresponding EP Application No. 15193257.1 dated Jun. 1, 2016.

(Continued)

*Primary Examiner* — Nguyen Tran
(74) *Attorney, Agent, or Firm* — Wood IP LLC

(57) ABSTRACT

A power switch apparatus for a power converter includes a semiconductor power switch and a gate drive unit connected to the semiconductor power switch for supplying gate drive signals to the semiconductor power switch to switch it on and off to cause the power converter to generate an alternating current voltage having a nominal operational frequency based on command signals received from a controller. The gate drive unit receives command signals based on the AC voltage to be generated and to alter the switching events of the semiconductor power switch by addition of a (Continued)

pre-defined jitter-like deviation to the gate drive signals such as to cause the power converter to generate an AC voltage having a modified operational frequency which partly and temporarily deviates from the nominal operational frequency by a pre-defined minimum percentage. A power converter comprising such a power switch apparatus is also disclosed.

20 Claims, 7 Drawing Sheets

(51) Int. Cl.
   *H02M 5/293* (2006.01)
   *H03K 17/28* (2006.01)
(58) Field of Classification Search
   CPC .... H02M 5/4585; H02M 5/451; H02M 5/452; H02M 7/7575; H02M 7/5395; H02M 7/122; H02M 7/5387; H02M 7/53871; H02M 7/521; H02M 7/53875; H02M 7/537; H02M 7/5383

USPC ......... 363/34–37, 40–41, 55–56.11, 98, 131, 363/132
See application file for complete search history.

(56) References Cited

U.S. PATENT DOCUMENTS

| | | | |
|---|---|---|---|
| 7,729,146 B2* | 6/2010 | Hayami | H02M 7/53871 318/801 |
| 8,923,365 B2 | 12/2014 | Zoels et al. | |
| 2005/0206361 A1 | 9/2005 | Ito | |

OTHER PUBLICATIONS

International Search Report and Written Opinion issued in connection with corresponding PCT Application No. PCT/GB2016/053370 dated Feb. 23, 2017.

* cited by examiner

TAMPER-RESISTANT POWER SWITCH APPARATUS FOR A POWER CONVERTER AND POWER CONVERTER

FIELD OF THE INVENTION

Embodiments of the invention relate generally to power converters and more specifically to a tamper-resistant power switch apparatus for a power converter and a power converter comprising same.

BACKGROUND OF THE INVENTION

Converters are utilized in a variety of applications, such as for high speed motor and industrial machine drive applications and for energy generation and storage applications. For example, many hybrid or electric vehicles include an electric traction drive system that includes a 3-phase permanent magnet alternating current (AC) electric machine that is driven by a converter. The converter is supplied with power from a direct current (DC) power source, such as a storage battery, or from an AC power source, such as a wind turbine, wherein AC power is transformed into DC power by an AC to DC power converter or rectifier. Windings of a 3-phase AC electric machine can be coupled to converter legs (phase legs) of the power converter, wherein each converter leg includes a number of switches. Each switch is controlled by an associated gate drive unit which, based upon control signals from a central controller, generates ON/OFF switching signals that are provided to the corresponding switch. The switching signals applied to the converter legs of the converter cause the switches of the converter legs to switch on and off in an appropriate manner to convert the DC power to AC power. This AC power drives the AC electric machine, which in turn drives a shaft of the hybrid or electric vehicle drive train. Similar applies if AC power is to be converted into DC power by a converter, such as for use in high voltage direct current (HVDC) applications, for example.

In some high speed motor applications, such as for uninterruptible power supply using flywheel generators, for example, high speed induction motors are driven by an AC to AC power converter with a speed of more than 6,000 rpm. There are high speed drive systems which are capable of directly driving turbo-compressors at speeds of up to 20,000 rpm. In such high speed motor drive systems the motor fundamental frequency can vary from 100 Hz to 300 Hz, which requires high operating frequencies in the range of several hundred Hz or several kHz.

In the past gate drive units used in power converters were analog power amplifiers that excepted a low-power input from a central controller and produced a high-current drive input for the gate of a high-power transistor, such as an insulated gate bipolar transistor (IGBT) or a power metal-oxide-semiconductor field-effect transistor (MOSFET), used in a power converter. Recently, digital gate drive units have been developed for use in power converters. For example, U.S. Pat. No. 8,923,365 B2 discloses a digital gate drive unit for a power converter comprising a programmable logic controller (PLC) or a field programmable gate array (FPGA) and further including a DC power supply, a command link connector, a memory, and several signal connections. The gate drive unit is connected with a central controller via a command link to receive command signals from the central controller. In response to the command signals, the gate drive unit may select one of a plurality of pre-determined values or set points for the gate drive voltage that are stored in a lookup table within the memory and adjust the output stage to match the driving strength to the set point. The central controller and the gate drive unit communicate with each other via the command link such that the central controller may provide configuration and operational data to the gate drive unit on the same link as used for the ON/OFF command signals via modulation of the command signal and the gate drive unit may return feedback information, such as measured sensor values, to the central controller. The transmission of reconfiguration data permits in-operation re-programming of the gate drive unit as a field change or the like. Each gate drive unit transmits its serial number and the serial number of the corresponding semiconductor power switch to permit the central controller to authenticate the power converter components, so as to issue a reliable response to the command signal by the power converter. The feedback information allows the central controller to calculate and send configuration data for setting the gate drive unit to provide appropriate gate drive voltage to the corresponding power switch. With the newly introduced digital gate drive units and the communication of the gate drive unit with the controller it is possible to adapt the operational parameter to increase converter efficiency and to achieve a high accuracy of the voltages generated by the power converter.

Such high operational efficiencies and accuracies make the power converter also suitable for use in sophisticated high speed military and nuclear applications like for military aviation, military submarines or centrifuges for uranium enrichment. Such military and nuclear applications require high efficient, accurate and reliable converters which can provide exact high frequency voltages with a voltage and frequency stability within a prescribed tolerance. Modern high frequency converters and high speed drives utilizing same are able to meet such highly demanding requirements.

One issue with the modern technology of power converters is the risk for dual use of parts of the power converters such that a converter that was originally developed for civilian applications might be misused in a military application. For example, power converters intended for civilian applications might be disassembled into pieces and be assembled with other parts and reconfigured for use in military or nuclear weapon applications. It is desired to protect power converters against such a tampering and overbuilding.

In order to prevent dual use or misuse of high technology originally developed for civilian applications in military or nuclear applications, many countries impose export restrictions on such high technology products and equipment which meet or exceed certain performance characteristics. For example, in connection with frequency changers, converters or inverters which can easily be removed or used for other purposes, including military and nuclear purposes, U.S. export control regulations are very restrictive in defining that any power converter and the like, where the hardware can achieve an output frequency higher than 599 Hz with a frequency stability better than 0.2% will require an export license. Similar regulations also exist in the European Union and in other countries throughout the world. Obtaining an export license might be problematic, time consuming and costly. It is desired to achieve that higher frequency converters that can be used in civilian applications do not fall under the export control restrictions.

BRIEF DESCRIPTION OF THE INVENTION

In view of the foregoing, it is an object of embodiments of the present invention to provide a power switch apparatus for a power converter and a power converter comprising same, which can remove at least some of the above mentioned deficiencies. In particular, it is an object of embodiments of the present invention to provide a power switch apparatus for a power converter and a power converter utilizing same, which can reduce the risk for misuse of the whole or parts of a power converter that was originally developed for a civilian application in a military or nuclear application and the like. Moreover, it would be desirable to achieve that high frequency power converters that would currently fall under some export control restrictions because of their performance characteristics can be exported for use in civilian applications without requiring an export control license.

According to one aspect of embodiments of the present invention, a power switch apparatus for a power converter is provided, which comprises a semiconductor power switch and a gate drive unit connected to the semiconductor power switch for supplying gate drive signals to the semiconductor power switch to switch it on and off to cause the power converter to generate an alternating current (AC) voltage having a nominal operational frequency based on command signals received from a controller. The gate drive unit is configured to receive the command signals based on the AC voltage of the nominal operational frequency to be generated and to alter the switching events of the semiconductor power switch by addition of a deviation to the gate drive signals such as to cause the power converter to generate an AC voltage having a modified operational frequency which at least partly and temporarily deviates from the nominal operational frequency by at least a pre-defined minimum percentage.

According to embodiments of the present invention the gate drive unit modifies the gate drive signals corresponding to the command signals received from the controller, which correspond to the nominal operational frequency, so as to achieve that the generated AC voltage at least partly and temporarily deviates from the nominal operational frequency by at least a minimum deviation or error as specified by the pre-defined minimum percentage value. This is achieved by addition of a deviation to the gate drive signals. This deviation is based on a random selection of switching event alteration, i.e. by randomly varying the timing of the gate drive signals, or may be based on deterministic patterns. If deterministic patterns are used then they should be applied based on complex algorithms to avoid or at least greatly reduce the risk that the deterministic pattern can be understood and counteracted from outside. The pre-defined minimum percentage defines a specified stability tolerance range for the frequency of the generated AC voltage as desired or requested by a specific application. Here, it might be the specified stability tolerance range as requested by a specific military aviation, submarine or nuclear application. The term "temporarily" means in this connection that the generated modified operational frequency must not be continuously outside the pre-defined stability range within a defined time period but may fall alternately inside and outside the specified stability range. The term "partly" means in this connection that the modified operational frequency may have a frequency component corresponding to the nominal operational frequency as requested by the controller using the command signals, but has also at least one significant additional modified frequency component outside the specified stability tolerance range. This additional modified frequency component is significant if the signal at this frequency component has significant energy which is above a minimum energy threshold. The minimum energy threshold may be 10% of the energy at the nominal operational frequency component, for example. Another minimum energy threshold, such as at least 20% in some embodiments, may apply as desired or requested by a specific application. In any case, the gate drive unit of the power switch apparatus according to embodiments of the present invention makes it impossible to achieve a frequency stability better than the tolerance margin corresponding to the pre-defined minimum percentage.

Thus, a power switch apparatus for a power converter and a power converter can be realized which can generate AC voltages of high frequencies higher than a minimum pre-defined frequency threshold defined by a specific export control regulation, for example, but is not able to achieve a frequency stability better than the pre-defined minimum percentage and would, therefore, not require an export control license. As an example, the gate drive unit can generate a frequency higher than 599 Hz with a frequency stability worse than 2.0% only, such that the power converter would not fall under the U.S. export control restrictions and would not require an export license. Minimum pre-defined frequency thresholds other than about 600 Hz and pre-defined minimum percentage values other than 0.2% may apply according to export control regulations from other countries and communities.

In any power switch apparatus mentioned above, the semiconductor power switch is, in an embodiment, of a type selected from an insulated gate bipolar transistor (IGBT), a bi-mode isolated gate power transistor (BiGT), a metal-oxide-semiconductor field-effect transistor (MOSFET), a junction gate field-effect transistor (JFET), an integrated gate-commutated thyristor (IGCT) or a gate turn-off thyristor (GTO) and any other controllable semiconductor power switch. The semiconductor power switch comprises a control terminal connected to the gate drive unit for receiving the gate drive signal therefrom.

In an embodiment of the present invention, the gate drive unit may be configured to alter the switching events only if the operational frequency of the AC voltage to be generated is equal to or higher than a minimum pre-defined frequency threshold. The frequency threshold is, in an embodiment, a configurable parameter, which may be changed as desired or required by a specific application. In one configuration this pre-defined frequency threshold may be about 600 Hz to correspond to the operating frequency threshold of U.S. export control regulations. Other values may apply for other export control regulations and applications.

In an embodiment, the gate drive unit may be configured to obtain nominal operational frequency information such as by extracting it from the command signals received from the controller or deriving it from local measurements at the gate drive unit, e.g. direct or indirect current measurements, recognize when the nominal operational frequency obtained is equal to or higher than the minimum pre-defined frequency threshold, and start altering the switching events as a result of this recognition. The gate drive unit may receive nominal operational frequency information embedded in the configuration and operational data stream received from the controller or may extract the nominal operational frequency information using the command signal from the controller and an internal clock signal. As a further alternative, the gate drive unit may receive the nominal operational frequency from sensors included in the power converter. As soon as the gate drive unit recognizes that the nominal operational frequency or the current operational frequency arrives or exceeds the minimum pre-defined frequency threshold, it may switch to the modified operational mode to alter the switching events of the corresponding semiconductor power switch to place the frequency of the generated AC voltage outside the stability tolerance range as desired or requested by the specific application.

As mentioned above, the pre-defined minimum percentage which defines the stability tolerance range may be about 0.2% in correspondence with the US export control restrictions or may be another value more or less than 0.2% in correspondence with the respectively applicable export control regulation or application.

The power switch apparatus of any type mentioned above may be for an AC to AC converter or a DC to AC converter (inverter) such that the generated AC voltage is the output voltage of the power converter. As an alternative, the power converter may also be a DC to DC converter, wherein the generated AC voltage may be an internal voltage of an intermediate AC stage of this DC to DC converter.

In order to alter the switching events of the corresponding semiconductor power switch, the gate drive unit may be configured to alter the frequency or timing of the successive gate drive signals by introducing a time-varying jitter-like component to the timing of the gate drive signals such as to provide a time-varying modified operational frequency of the generated AC voltage. The jitter is a deviation from the true timing of the gate drive signals which would be required to generate the nominal operational frequency. The jitter is thus related to the frequency of the successive ON/OFF gate drive signal pulses or the phase of the signals and may be called here a timing jitter. Usually, a jitter is an undesired factor in the design and operation of communication links and systems. Here, an intended jitter is added to the gate drive signals to avoid misuse of the power switch apparatus designed for civilian applications in military, nuclear or other critical applications by ensuring that the power converter will not meet the high performance characteristics required for these purposes. The jitter is, in an embodiment, a random jitter which may be based on noise present in any component of the switch apparatus or the power converter, for example, e.g. noise from analogue/digital converters used therein. Alternatively, the jitter may be a deterministic jitter which, as already indicated above, should then be based on a rather complex algorithm which cannot be easily understood or reverse-engineered.

As an alternative measure to alter the switching events, the gate drive unit may be configured to temporarily change or shift the timing of the gate drive signals such as to provide a constant modified operational frequency of the generated AC voltage which deviates from the nominal operational frequency by at least the pre-defined minimum percentage. However, this measure may be less preferable, since it may provide a stable output frequency even if outside of a specified frequency stability tolerance range. Moreover, this measure should rather be limited in time to one or more separate continuous timeframes each having a duration of only a few periods or even a fraction of a period of the operational frequency in order not to cause instability of the controller.

In order to be able to achieve its tasks, the gate drive unit of the power switch apparatus of any type mentioned above is, in an embodiment, a digital gate driver which is implemented as an integrated circuit device, in an embodiment, a System on Chip (SoC) FPGA device which comprises a microcontroller, a flash-based FPGA fabric having a multitude of programmable logic elements, a non-volatile memory device for data and code storage, and I/O peripheral interfaces. The non-volatile memory device may store voltage values of a gate drive voltage to be applied to the semiconductor power switch for activating the power switch to deliver current to a load, wherein the controller may select the appropriate gate drive voltage value in response to the command signal received from the controller. The non-volatile memory device may further store a minimum pre-defined frequency threshold for applying the modified operation mode and the pre-defined minimum percentage which specifies the frequency stability tolerance margin for the AC voltage frequency generated. The non-volatile memory device may further store pre-defined jitter parameters or functions to be applied to the switching events during the modified operational mode of the gate drive unit and the power converter.

The digital gate drive unit configuration as mentioned above further allows the gate drive unit to include integrated security features to provide information security of configuration data, to protect the access to memories and to provide anti-counterfeiting and anti-tamper protection. A secured processing unit may be provided which is widely protected against tampering and overbuilding.

In particular, the gate drive unit may be arranged to communicate with the controller using an encrypted communication protocol. Bitstreams are encrypted using a special security key which may be a default key or a user selected security key or a factory key, as desired, wherein non-default keys are loaded into the device using an encryption algorithm. Plaintext bitstreams may not be transmitted between the controller and the gate drive unit. An appropriate encryption, such as using the advanced encryption standard (AES) symmetric cypher with 256 bit long keys and adding authentication tags based on an appropriate algorithm, such as the Secure Hash Algorithm (SHA-256), make it difficult or almost impossible to read, counterfeit and tamper the information exchanged between the controller and the gate drive unit.

In a preferred implementation of the power switch apparatus comprising integrated security features, the gate drive unit is further arranged to operate and cooperate with the controller only if it receives a valid passcode from the controller and to otherwise cease operation and avoid supplying gate drive signals to the semiconductor power switch. The passcode may be added to every bitstream transmitted from the controller to the gate drive unit, in particular in an encrypted communication protocol, to issue that only recognized gate drive units cooperate with the central controller.

Further functionalities may be implemented in the gate drive unit to protect it against tampering and overbuilding, such as provisions to control or protect access to the FPGA hardware and to memories, to prevent back-tracking, to detect tampering attempts, to allow programming of the gate drive unit through dedicated ports and after authentication against security keys only, to deactivate ports, and others, to enhance design and data security. This will prevent that a high frequency power converter or drive system may be reconfigured, disassembled and reassembled such as to be dual used in violation of the above mentioned ordinances. This task may be effectively achieved by combining the measures of altering the switching events of the semiconductor power switches with the enhanced security features mentioned above.

In another aspect of the invention, a power converter is provided, which comprises a controller for controlling operation of the power converter, a plurality of semiconductor power switches, and a plurality of gate drive units in communication with the controller for receiving command signals therefrom and connected to supply gate drive signals for the plurality of semiconductor power switches to switch them on and off to cause the power converter to generate an alternating current (AC) voltage having a nominal operational frequency based on the command signals received from the controller. At least one of the plurality of gate drive units is configured to receive a command signal based on the AC voltage of the nominal operational frequency to be generated and to alter the switching events of the corresponding semiconductor power switch by addition of a deviation, more particularly a jitter-like deviation, to the gate drive signals such as to cause the power converter to generate an AC voltage having a modified operational frequency which at least partly and temporarily deviates from the nominal operational frequency by at least a predefined minimum percentage.

Further embodiments of the power converter include the various embodiments of the inventive power switch apparatus mentioned above, which may also be implemented in the power converter. The corresponding embodiments of the power converter also benefit from the advantages of the above mentioned embodiments of the power switch apparatus.

Further aspects, objects and advantages will be apparent from the following detailed description when taken in conjunction with the accompanying drawings, from the drawings as such or the following claims.

BRIEF DESCRIPTION OF THE DRAWINGS

The accompanying drawings, which are incorporated herein and constitute a part of the specification, illustrate an embodiment of the invention and, together with the description, serve to explain the advantages and principles of the invention without limiting the invention to the specific embodiments shown and described. Like reference numerals are used to refer to like elements throughout the drawings, wherein.

DETAILED DESCRIPTION

Figure 1:
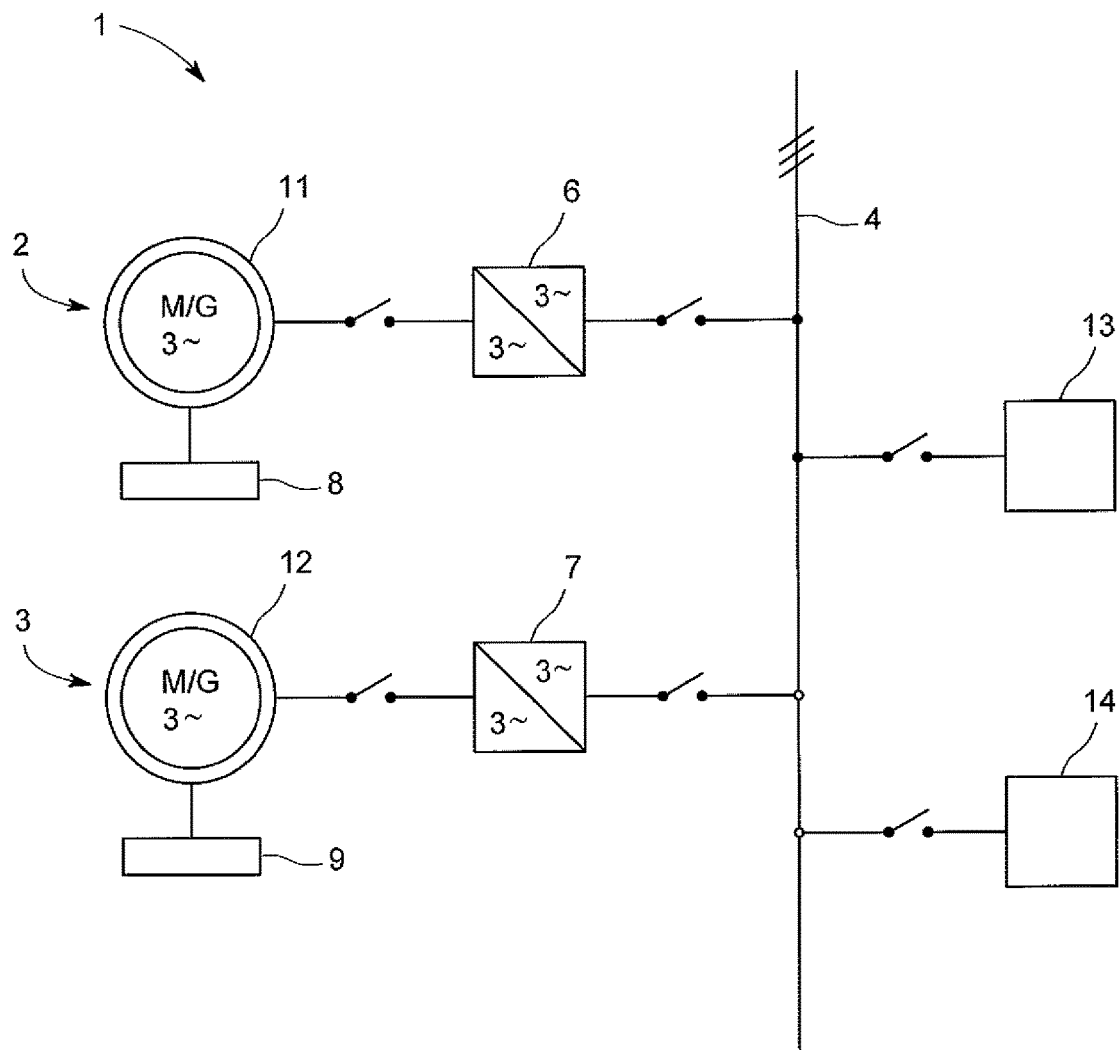
FIG. 1 is a schematic view of a drive system including three-phase semiconductor power converters, which can be controlled by gate drive units, and further comprising large flywheel generators for storing and providing energy.

Reference will be made below in detail to exemplary embodiments of the invention, examples of which are illustrated in the accompanying drawings. Wherever possible, the same reference characters used throughout the drawings refer to the same or like parts. Although exemplary embodiments of present invention are described with respect to power converters, embodiments of the invention are also applicable for use with other devices comprising semiconductor power switches, i.e., any solid state devices suitable for switching current to power load.

FIG. 1 is a schematic view of a power supply system 1 in which embodiments of present invention can be used. The power supply system is a flywheel energy storage system which includes a number of flywheel energy storage units or sub-systems 2, 3 which are connected or connectable to a source of power, such as an electricity grid, e.g., a public electricity network, through power supply lines 4. Although only two flywheel energy storage units or sub-system 2, 3 are shown in FIG. 1, the power supply system 1 may have any number of such units or sub-systems, and the two units of FIG. 1 are merely exemplary. The flywheel energy storage sub-systems 2, 3 are connected in parallel to the 3-phase power supply lines 4 through respective AC to AC power converters 6, 7 which adapt the voltage and frequency of the power supplied by the power supply lines 4 to a respective voltage magnitude and frequency required for the flywheel energy storage units 2, 3. An exemplary configuration of an AC to AC power converter 6, 7 which can be used for this purpose is discussed below in connection with FIG. 2.

The flywheel energy storage units 2, 3 each include a flywheel 8, 9 mounted in a suitable housing (not shown) that turns at a relatively high speed, such as up to 15,000 rpm, for example. The flywheel 8, 9 is coupled to a motor/generator 8, 9 which can be synchronous motor/generator but could also be an induction motor. When a three-phase alternating current (AC) is supplied to the motor/generator 11, 12 from the power supply lines 4, the motor/generator 11, 12 functions as a motor to turn the corresponding flywheel 8, 9 to a predetermined initial speed. In the reverse case, when the flywheel 8, 9 is turning, the motor/generator 11, 12 can be set to function as a generator to produce three-phase AC power which is supplied to the bi-directional AC to AC power converter 6, 7 which converts the three-phase AC voltage from the motor/generator 11, 12 to a voltage magnitude and frequency suitable for the power supply grid. The power converter 6, 7 then supplies the AC power generated to a load 13, 14 which is connected to the power supply lines 4, 5. The load 13, 14 may be any application or electrical device for which a continuous supply of electricity is important. A reliable source of backup power as shown is frequently called an Uninterruptable Power Supply, or UPS.

Although FIG. 1 shows a power supply system based on a flywheel generator for energy storage and retrieval, a battery backup system comprising a number of batteries which are connected together to provide power when the main power supply fails could be used instead of the flywheel generator for energy storage and retrieval. A bidirectional AC/DC power converter would then be needed for converting AC to DC power and vice versa. Moreover, embodiments of the invention may also be used in other applications, such as for high speed motor and industrial machine drive applications for civil high speed motors used in marine propulsion systems, ship drive systems, in the oil and gas industry and others, where power converters like AC to AC converters, DC to DC converters and AC/DC converters with high switching frequency are needed to generate high power high frequency output voltages in the kV and kHz range.

Figure 2:
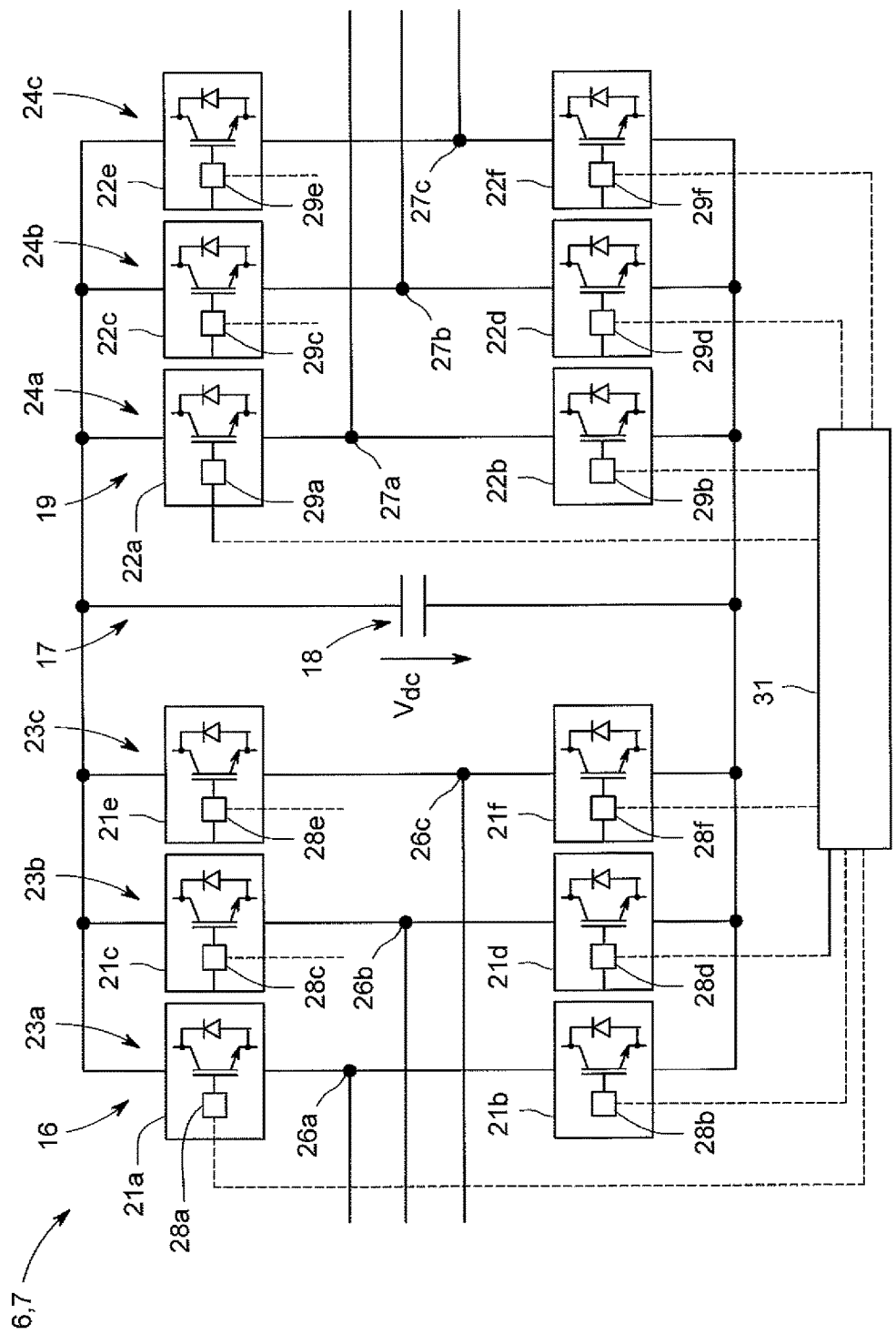
FIG. 2 is a schematic view of a three-phase semiconductor power converter which can be controlled by gate drive units.

FIG. 2 shows in schematic view an embodiment of an AC to AC power converter 6 (or 7) which might be used in a high speed drive system or the power supply system 1 of FIG. 1. As is shown in FIG. 2, and assuming an energy flow from the left side to the right side in FIG. 2, the AC to AC power converter 6 comprises an AC to DC converter stage or power rectifier 16, which delivers a direct voltage Vdc to a DC link 17 connected across a capacitor 18, and a DC to AC converter stage or power inverter 19. If the energy flow is from right to left in FIG. 2 the functions of the converter stages 16, 17 are reverse such that converter stage 19 then functions as a rectifier and converter stage 16 then functions as an inverter.

Each of the converter stages 16 and 19 includes a number of switch apparatus 21a-f and 22a-f, respectively, which are also referred to herein as switch modules. Two of the switch apparatus 21a-f and 22a-f, respectively, are connected in series to each other to form a phase leg 23a-c and 24a-c of the converter stage 16 and 19, respectively, wherein all phase legs 23a-c and 24a-c are connected parallel to each other and to the DC link capacitor 18. The connection point of each two serially connected switch apparatus 21a and 21b, 21c and 21d, 21e and 21f, 22a and 22b, 22c and 22d, 22e and 22f forms a corresponding AC terminal or node, such as an AC input terminal 26a-c and an AC output terminal 27a-c, of the AC to AC power converter 6, 7. Each switch apparatus 21a-f, 22a-f is controlled or switched on and off and monitored by an associated gate drive unit 28a-f, 29a-f, as further discussed below. The gate drive units 28a-f, 29a-f are supervised and coordinated by a central controller 31.

Figure 3:
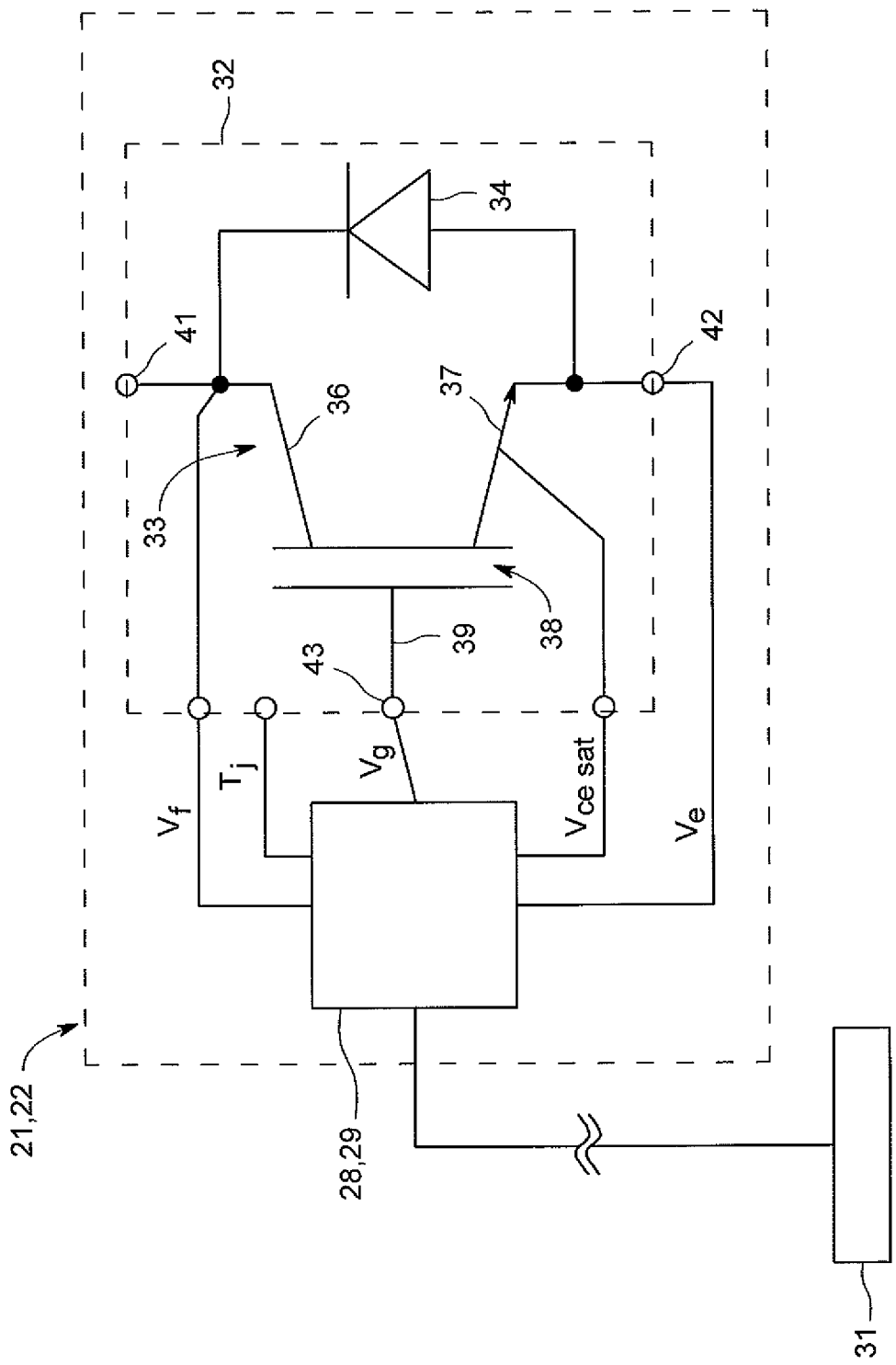
FIG. 3 is a schematic view of a switch apparatus of the power converter shown in FIG. 1, including a semiconductor power switch and a gate drive unit.

FIG. 3 shows in schematic view a switch apparatus 21 which may be representative of any of the switch apparatus 21a-f and 22a-f shown in FIG. 1. The switch apparatus 21 includes within its case 32 a semiconductor power switch 33 and a freewheel diode 34. The semiconductor power switch 33 is suitable for high power applications and may be designed as IGBT (Insulated Gate Bipolar Transistor), although other power semiconductors, such as field effect transistors, in particular MOSFETs, gate turn off (GTO) thyristors, Integrated Gate-Commutated Thyristors (IGCTs), and other comparable switchable electronic components may be used. Herein, the semiconductor power switch 33 has a collector 36 and an emitter 37 that are joined by a junction 38. At the junction, a gate 39 is connected to receive a gate voltage Vg and a gate current Ige from an associated gate drive unit 28. The gate drive unit 28 is representative of any of the gate drive units 28a-f and 29a-f shown in FIG. 1. The terms collector, emitter and gate, as used herein, relate to the preferred usage of IGBTs as the power semiconductor switches in the power converter 6, 7. A skilled person will be familiar with other corresponding terms for the terminals and electrodes of other comparable semiconductor switches and will apply the description herein accordingly thereto.

The freewheel diode 34 is connected anti-parallel to the semiconductor power switch 33, such that the anode of the freewheel diode 34 is connected to the emitter 37 while the cathode of the freewheel diode 34 is connected to the collector 36. Depending on the location in the power converter 6, 7 in FIG. 2, the collector 36 is connected to either a positive node of the DC link 17 or to the emitter of a serially connected switch apparatus 21a-f, 22a-f and to one of the AC input or output terminals 26a-c and 27a-c, respectively, via a collector terminal 41 included in the switch apparatus case 32. The emitter 37 is connected to the negative node of the DC link 17 at the low side of the capacitor 18 or to the collector terminal 41 of the serially connected switch apparatus 21a-f, 22a-f and the AC input or output terminal 26a-c, 27a-c, via an emitter terminal 42 included in the switch apparatus case 32. The gate drive unit 28 (or 29) is connected to the semiconductor power switch gate 39 via a gate or control terminal 43.

Although FIG. 2 shows only a single semiconductor power switch 33 and a single freewheel diode 34, in other embodiments, multiple power switches connected in series or in parallel to each other and having anti-parallel freewheel diodes may be housed within a single switch apparatus.

Figure 4:
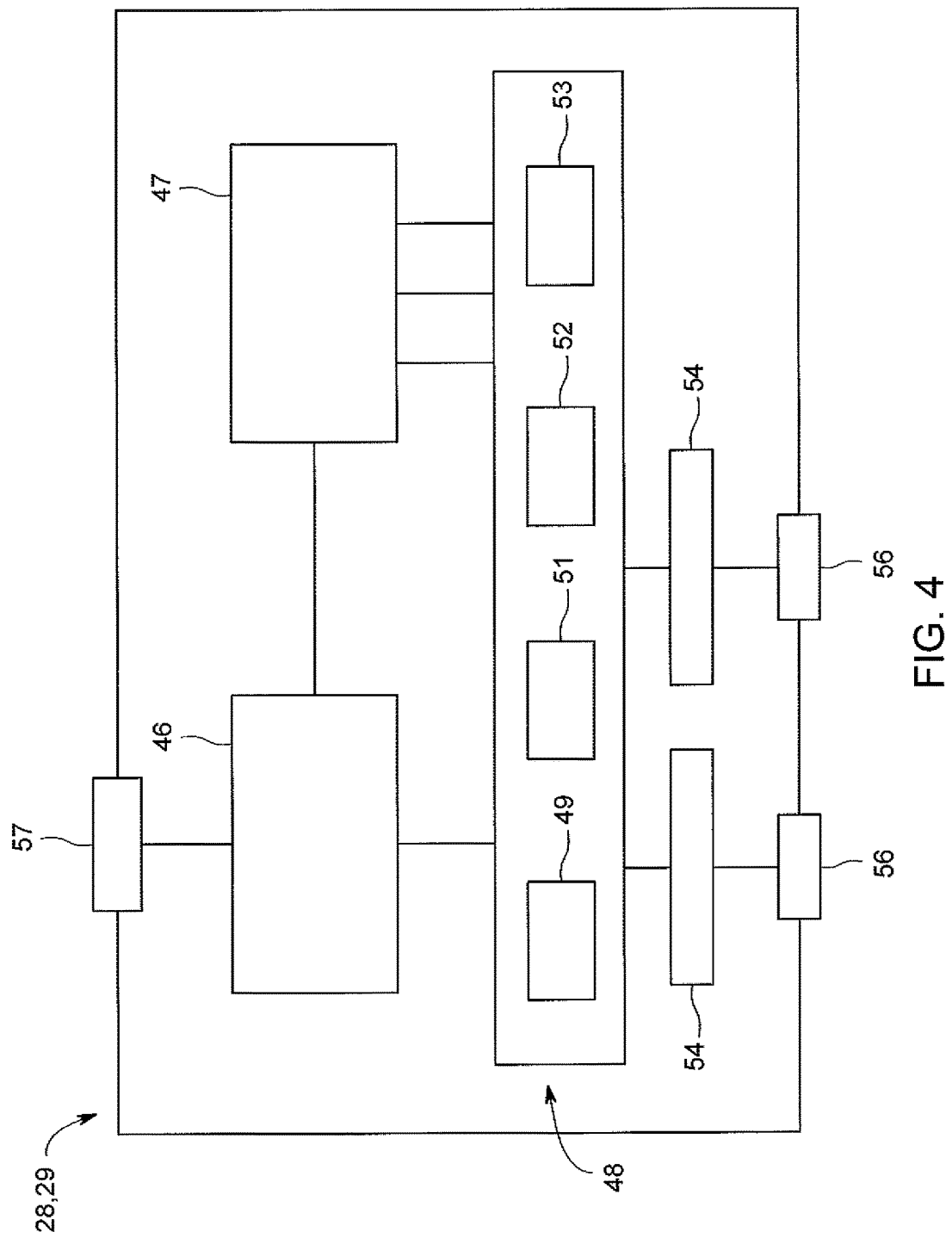
FIG. 4 is a schematic block diagram of a gate drive unit used in the switch apparatus shown in FIG. 3.

As mentioned above, an important issue with the technology of high voltage, high frequency drives utilizing high frequency converters is the risk for dual use of parts, e.g., misusing a power converter that was originally developed for a civilian application in a military application. To avoid or at least reduce misuse, tampering and overbuilding of the power converter or its parts, the gate drive unit 28 is a digital, electronic unit with its own intelligence. For example, as is shown in FIG. 4, the gate drive unit 28 (or 29) may be implemented as an integrated circuit device which is a System on Chip (SOC) FPGA device comprising a system controller 46, a microcontroller subsystem 47, a flash-based FPGA (Field Programmable Gate Array) fabric 48, non-volatile memory devices and various input/output (I/O) interfaces. The system controller 46 may serve to supervise operation of the gate drive unit 28 and, in an embodiment also supervises and authenticates programming of the gate drive unit to avoid abuse. The microcontroller subsystem 47 has multiple interfaces to the FPGA to allow for peripheral expansion and algorithm acceleration in the FPGA fabric 48. The FPGA fabric 48 includes logic cells distributed as hardware across the whole chip for storing code required for operation of the FPGA fabric 48. A flash memory device, shown as a functional block 49 in FIG. 4, is used for storing configuration and operational data. In contrast to SRAM-based FPGAs, which have to be configured at each power-up, flash-based FPGAs need to be configured only once, since the configuration data can be stored mainly in the non-volatile flash. Nevertheless, the FPGA chip 48 may further comprise or be connected to a static memory 51, such as an SRAM, for data storage during operation. The SRAM 51 may also be disposed outside the FPGA fabric 48. Moreover, as is generally known, the FPGA fabric 48 further comprises lookup table (LUT) logic elements 52 which can be programmed or configured by the user, and mathematical blocks 53 having digital signal processing capabilities.

The FPGA fabric 48 is connected via serial controllers 54 to a number of serial I/O interfaces, one of which may be used for connection to the corresponding semiconductor power switch 33. A dedicated I/O interface, such as a serial peripheral interface (SPI) 57, may connect the system controller 46 to the central controller 31 of the system 1 to allow control of the gate drive unit 28 by the central controller 31 and a communication between the central controller 31 and the gate drive unit 28.

Figure 5:
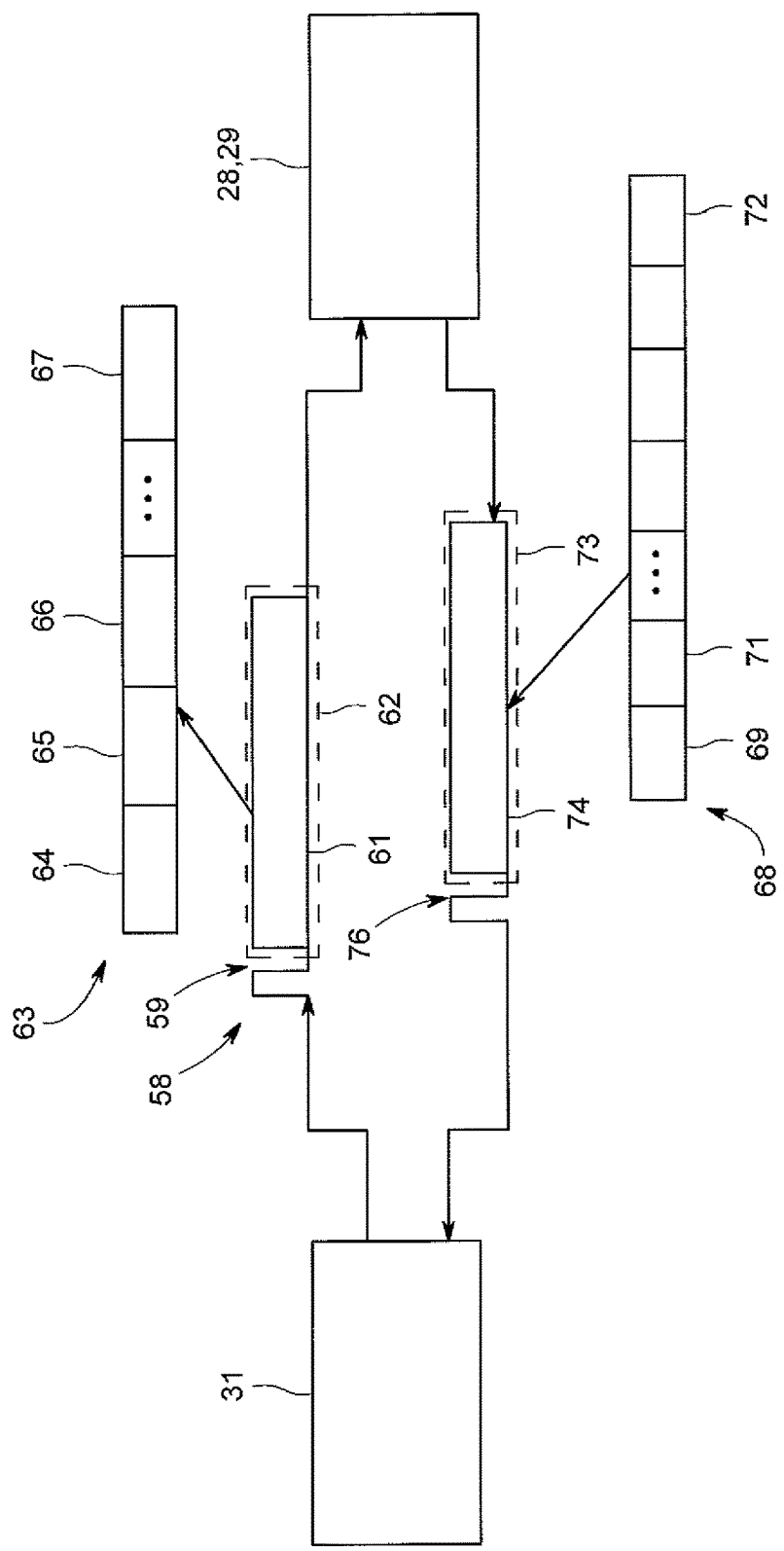
FIG. 5 shows a schematic view of signal formats usable in a two-way communication protocol between a central controller and a gate drive unit.

FIG. 5 is a schematic view showing a communication between the central controller 31 and the gate drive unit 28 according to an exemplary embodiment of a communication protocol according to embodiments of the present invention. As is indicated in FIG. 5, the controller 31 delivers command signals 58 to the gate drive unit 28 at an appropriate switching frequency, such as 1 kHz, for example. The command signals 58 cause the gate drive unit 31 to select one of a plurality of predetermined and pre-stored values or set points for the gate drive signal voltage Vg, which are stored in a lookup table within the flash memory 49 or the static memory 51. The gate drive unit 31 then provides a gating signal corresponding to the set point at the respective I/O peripheral interface 56 connected to the corresponding semiconductor power switch 33. The gating signals are provided at a predetermined timing, usually immediately after receipt of the command signal 58 without any unnecessary delay. In this regard, the gate drive unit 28 substantially acts as an amplifier for the command signals 58.

As is further shown in FIG. 5, following a notch 59, which is a brief inversion (LOW to HIGH to LOW or HIGH to LOW to HIGH) of the command signal 58 and which indicates the begin of the command signal 58, a data frame 61 including configuration data is transferred from the controller 31 to the gate drive unit 28. The data frame 61 may have any predetermined bit length, such as 64 bits, for example. In order to prevent reading the data by snooping at the communication link between the controller 31 and the gate drive unit 28 and a possible tampering of the data, the data frame 61 is transferred using an encrypted communication protocol according to an advanced encryption standard, such as the AES-standard 256 which uses a symmetric cypher with 256-bit keys. An authentication tag can be added based on a secure hash algorithm, such as the SHA-256, for cryptographic hash functions to allow the gate drive unit 28 to determine the data's integrity. Other encryption and cryptographic hash algorithms may be used if desired. No plaintext bitstream is transferred from the central controller 31 to the gate drive unit 28 and vice versa. The encryption of the data is indicated in FIG. 5 by dashed lines 62 surrounding the data frame 61.

The decrypted data frame, i.e. the data frame 61 decrypted by the gate drive unit 28, is indicated by reference sign 63 in FIG. 5. As may be seen from FIG. 6, this data frame 63 comprises reconfiguration data which can include operational parameters, such as an updated target value of a gate voltage Vg, as well as updated threshold values for some operational parameters used for health monitoring purposes, among others. For example, the format of the decrypted data 63 may provide for transmitting a write address 64 of an operational parameter to be adjusted, as well as a new value 65 for adjusting the operational parameter. This permits in-operation re-programming of the gate drive unit 28 in the field based on the receipt, handling, and storage of the incoming reconfiguration data. The decrypted data 63 may further include a read address 66 which corresponds to a storage location of a specific measured value within the memory 49 or 51 of the gate drive unit 28, in response to which the gate drive unit 28 may send the measured value to the central controller 31.

Still further, decrypted data 63 includes a passcode 67 which the gate drive unit 28 can compare with a known or expected passcode to determine whether the central controller 31 is the controller designed for communication and cooperation with the particular gate drive unit 28. The gate drive unit 28 continues to operate and communicate or cooperate with the central controller 31 only if it receives a valid passcode 67 from the controller 31. Otherwise, if the passcode 67 received is invalid, the gate drive unit 28 ceases operation and avoids supplying gate drive signals Vg to the corresponding semiconductor power switch 33. Thus, the system only operates if the central controller 31 and the gate drive unit 28 exchange a valid passcode 67 in an encrypted communication protocol. Only recognized gate drive units 28 can operate with the central controller 31 and vice versa. This functionality of the gate drive unit 28 is implemented in a secured processing unit 46-49 which is protected against tampering and overbuilding. This prevents the disassembly of the drive system or power converter 6, 7 into pieces and reassembly of the pieces in another combination for use in violation of ordinances, like export control regulations and others.

Referring again to FIG. 5, it may be seen that the gate drive unit 28 transmits feedback information 68 to the central controller 31. This feedback information 68 may include a gate drive unit serial number 69 and a semiconductor power switch serial number 71 which permit the central controller 31 to authenticate power converter components, so as to assure reliable response to the command signal 58 by the power converter 6, 7. Further, the feedback information 68 may include operational data, such as the output voltage and current Vce, Ice of the semiconductor power switch 33 and the semiconductor power switch junction temperature Tj, for example. These parameter data enable the central controller 31 to calculate and send the configuration data 61 for setting the gate drive unit 28 to provide appropriate gate drive voltages Vg. The feedback information 68 further comprises a passcode 72 which enables the central controller 31 to verify that the received feedback information 68 originates from an authorized gate drive unit 6, 7.

As in the case of the command signal 58 with the encrypted configuration data 61, the feedback information 68 is encrypted using the accepted advanced encryption standard, as is indicated by the dashed lines 73 surrounding the feedback data frame 74. The feedback data frame 74 is transmitted to the central controller 31 immediately after sending a notch 76 which indicates to the central controller 31 that the gate drive unit 28 sends operational data. For details on a possible communication protocol which may be used for information exchange between the central controller 31 and the gate drive unit 28 see, for example, U.S. Pat. No. 8,923,365 B2 which is incorporated herein in this regard by reference.

As mentioned above, the gate drive unit 28 includes integrated security features to provide information security of configuration data and to provide anti-counterfeiting and anti-tamper protection. This is facilitated by the secured communication between the gate drive unit 28 and the central controller 31 which exchange information and a passcode in an encrypted communication protocol. Further, the gate drive unit 28 may include functionalities to disable access through certain ports from outside, to detect tamper attacks, to prevent back-tracking, etc. Moreover, the gate drive unit 28 is designed to avoid misuse of the power converter as such or parts thereof such that the power converter 6, 7 or its parts, which were originally developed for civilian applications, might be misused in a military or nuclear application. To this end, the gate drive unit 28 is configured to alter locally the switching events of the corresponding semiconductor power switch 33 controlled by the gate drive unit 28 by modifying the switching timing to generate a non-stable operational frequency of the power generated by the power converter 6, 7. This operational mode is described in connection with FIG. 6 in more detail.

Figure 6:
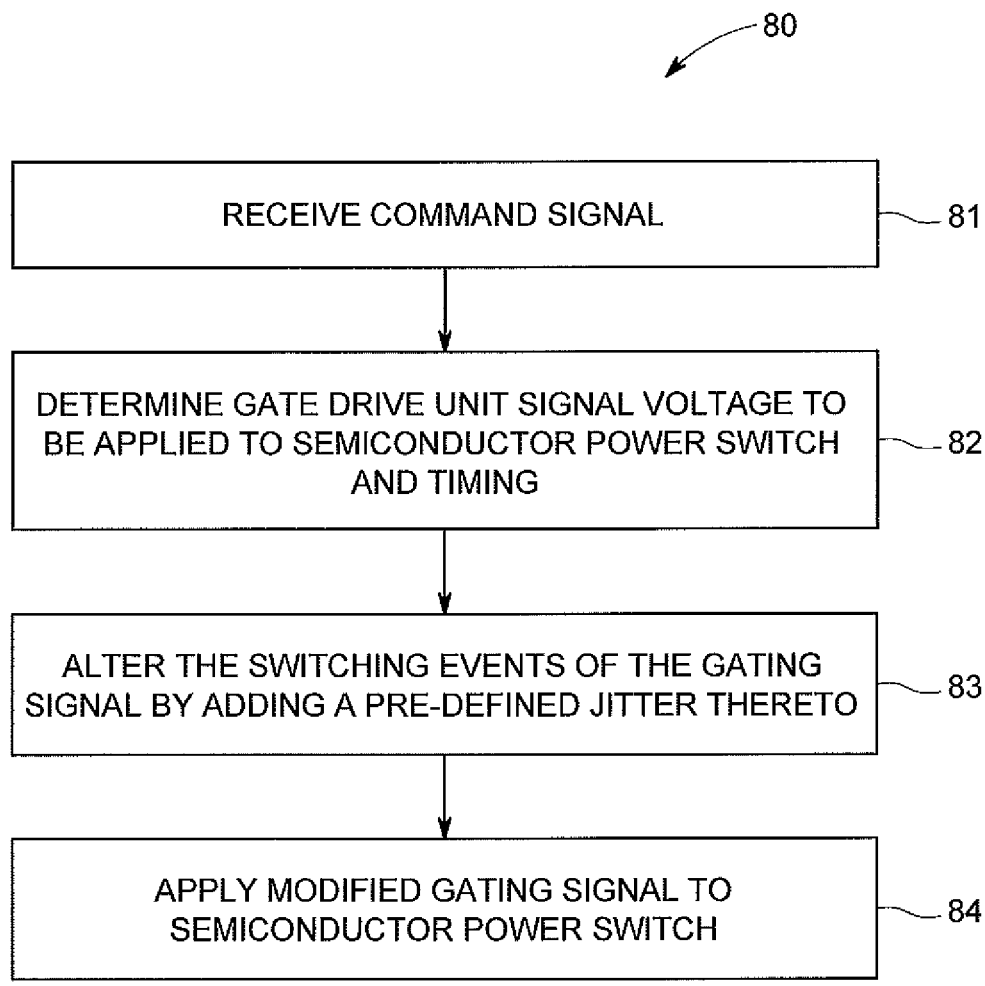
FIG. 6 is a flow chart of an operation method of a gate drive unit to reduce the risk of misuse thereof.

FIG. 6 shows a flowchart of an operational method 80 performed by the gate drive unit 28 in a modified operational mode. In this mode, the gate drive unit 28 initially receives the command signal 58 from the central controller 31 (step 81) and determines the gate drive signal voltage Vg to be applied to the gate 39 of the corresponding semiconductor power switch 33 (step 82). For this purpose, the gate drive unit 28 may extract the voltage Vg to be applied from a lookup table included in the FPGA fabric 48. As mentioned above, this voltage value may be adjusted by the central controller 31 by means of the configuration data 61 transmitted to the gate drive unit 28 together with the command signal 58.

In step 83, the gate drive unit 28 refrains from applying the determined voltage Vg at the exact switching timing determined by the command signal 58, e.g. immediately, but rather alters the switching timing by adding a pre-defined timing jitter thereto. In other words, the gate drive unit 28 varies the timing of the rising edge and/or of the falling edge of the gating voltage signal Vg to be applied to the corresponding semiconductor power switch 33 as compared with the nominal timing defined by the command signals 58 from the central controller 31. The amount of the jitter and whether it is to be applied to the rising and/or to the falling edge of the gating signal Vg is, in an embodiment, pre-defined and stored in one of the memories 49, 51 of the gate drive unit 28. The jitter is, in an embodiment, a random jitter which may be determined based on noise of an analogue to digital converter or another component used in the gate drive unit 28, for example. As an alternative, a deterministic jitter function may be applied based on a suitable algorithm which is difficult to keep track of.

Figure 7:
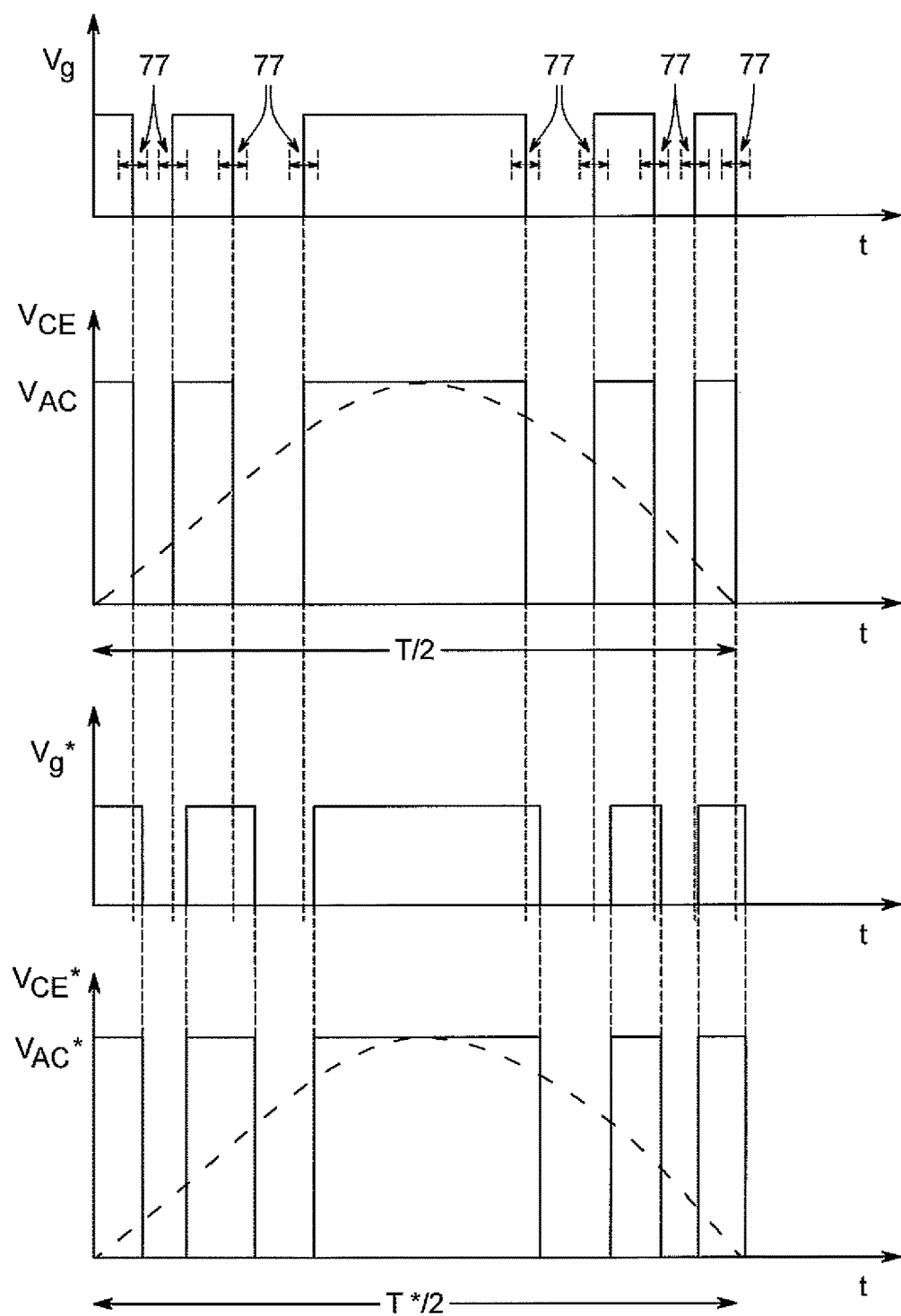
FIG. 7 shows a schematic view of waveform graphs showing the principle of the operation of the gate drive unit.

The effect of the addition of a pre-defined jitter to the gating signal is shown in the schematic view of FIG. 7. In the upper part a) of FIG. 7, the gating signals Vg are shown as pulse with modulated square wave signals of constant amplitude and varying pulse width. It should be noted that these signals and the other signals shown in FIG. 7 are illustrated in a very simplified manner and are intended to show the principle of the inventive measure only.

Applying the gating signals Vg to the gate 39 of a corresponding semiconductor power switch 33 results in a corresponding square wave output voltage signals $V_{CE}$ across the collector-emitter path of the semiconductor power switch 33, as shown in part b) of FIG. 7. The dotted line in part b) of FIG. 7 shows the resulting AC voltage, e.g., the output voltage of a converter, like the power converter 6, 7 of FIG. 1, which is the mean voltage of the voltage pulses $V_{CE}$ and can be obtained by smoothing the voltage pulses $V_{CE}$ by a corresponding line inductor (not shown). Only one half of the period T of the AC voltage $V_{AC}$ is shown, wherein the frequency of the resulting AC voltage $V_{AC}$ is f=1/T.

As is indicated by double arrows 77 in part a) of FIG. 7, the switching timing of the gating signals Vg can be varied in that the times of the rising and/or falling edges of the gating signals Vg can be delayed more or less such as to introduce a jitter-like deviation. Part c) of FIG. 7 shows a situation where the rising and falling edges of the gating signals Vg have been randomly varied or delayed relative to the rising and falling edges of the ideal gating signals Vg. The pulse width of the gating signals Vg* and the blank times between the gating signals Vg* are thereby varied, as well, compared to the signals Vg shown in part a) of FIG. 7.

As may be seen in part d) of FIG. 7, this alteration of the switching events results in a shifting, stretching and/or shortening the collector-emitter voltages $V_{CE}^*$ of the corresponding semiconductor power switch 33. In the example shown, it results in a correspondingly stretched AC voltage $V_{AC}^*$ which is output from the power converter 6, 7, for example. The period T* of the resulting modified AC voltage $V_{AC}^*$ is here slightly longer than the period T of the nominal AC voltage $V_{AC}$. Consequently, the modified AC voltage $V_{AC}^*$ has a frequency r=1/T* which is lower than the frequency f of the nominal AC voltage $V_{AC}$. In any case, it may be achieved that the modified AC voltage $V_{AC}^*$ has a modified frequency instead of or a modified frequency component f* in addition to the nominal frequency f, which at least partly and temporarily deviates from the nominal frequency f by at least a certain desired amount Δf.

By varying the timing of the rising and/or falling edges of the gating signals $V_g$ the modified operational frequency of the resulting AC voltage $V_{AC}^*$ can be shifted by any desired amount Δf around the center nominal frequency within a pre-defined frequency range to make it deviate from the nominal operational frequency by at least a pre-defined percentage.

Returning back to FIG. 6, in step 84 the gate drive unit 28 applies the modified gating signals Vg* with the switching events altered by addition of the pre-defined jitter-like component 77 to the corresponding semiconductor power switch 33. This results in a frequency shift or variation of the resulting AC voltage $V_{AC}^*$ of the power converter 6, 7 such that the resulting frequency no longer matches the nominal frequency. With a sufficient frequency variation, the gate drive unit 28 can make the power converter 6, 7 not usable for specific applications, such as a military application or nuclear application. Such applications mostly require generation of high frequencies with a pre-determined stability tolerance. By modifying the generated frequency such as to achieve a frequency which exceeds the set tolerance range, the gate drive unit 28 can make the power converter 6, 7 not suitable for or not usable in the above mentioned critical applications.

There are various export control restrictions as regards the export of high-tech electronic equipment in general and power converters in particular in various countries throughout the world. For example, U.S. regulations specify that power converters, including frequency changers, rectifiers and inverters, where the hardware can achieve a frequency higher than 599 Hz with a frequency stability better than 0.2% require an export license. Consequently, by predefining a jitter function, more particularly a random function, which is applied by the gate drive unit 28 during operation and results in a frequency stability worse than 0.2% for the respective nominal frequency higher than 599 Hz as the threshold frequency, the power converter hardware can be designed to generate an output frequency in the kHz range but would not fall into the export control restrictions and would not require an export-control license, because it is impossible to achieve a frequency stability better than 0.2%.

It should be noted that other values for the high frequency threshold and the frequency stability range differing from 599 Hz and 0.2% may apply in other countries or communities. Then these parameters may be set appropriately to correspond to the respective export control regulations.

Moreover, the frequency stability criteria applied in military applications or by export control regulations mostly require that the frequency stability requested is achieved within a predetermined time period, such as within a time period of eight hours, for example. Thus, as a further parameter, the gate drive unit may limit the alteration of the switching events to only one or more short sub-periods within the predetermined longer time period specified by the export control regulations, the military application, etc.

In one embodiment, the gate drive unit 28 may be arranged to add a jitter-like component to the switching timing for the gating signals such as to achieve that the generated output frequency is constant but deviates from the nominal frequency by at least the pre-defined minimum percentage, such as 0.2%, for example. In another embodiment, the gate drive unit 28 may be configured to apply a time-varying jitter function such as to achieve that the modified operational frequency f* oscillates around the nominal operational frequency f and temporarily and repeatedly exceeds the frequency stability range allowed. In still another embodiment, the gate drive unit 28 may alter the switching events such as to achieve that the generated frequency f* has both frequency components within the frequency stability range as well as additional significant frequency components outside of the specified frequency stability range. "Significant" means in this connection that this frequency component is notable within the frequency spectrum. For example, a frequency component having a signal energy of at least 10% or, in some applications least 15-20%, of the signal energy at the nominal operational frequency may be considered as significant.

In yet another embodiment, the gate drive unit may be configured to apply the modified operational mode such as to alter the switching events only if it detects that the operational frequency to be generated is higher than the frequency threshold, for example 599 Hz. The gate drive unit 28 can autonomously extract the frequency information from the timing of the command signals 58. Alternatively, frequency information may be transmitted from the central controller 31 to the gate drive unit 28 within the data frame 61. As a further alternative, the gate drive unit 28 can obtain the frequency information from sensor values, such as measured voltage values, received from various sensors within the switch apparatus or the power converter.

By combining the measures of altering locally the switching events within the gate drive unit by addition of the pre-defined jitter-like component to generate a non-stable operational frequency which differs from the high fundamental output frequency generated by the central controller 33, providing an intelligent decentralized programmable gate drive unit 28 which is implemented as a secured processing unit protected against tampering and overbuilding, implementing an information exchange between the gate drive unit 28 and the central controller in an encrypted communication protocol and exchanging a passcode to assure that only authorized pairs of central controller 31 and gate drive unit 28 communicate and cooperate with each other, a disassembly of a high frequency drive or power converter into pieces, reassembly, reconfiguration and misuse thereof or parts thereof in violation of the above mentioned ordinances can be effectively prevented.

A power switch apparatus 21 for a power converter 6, 7 is disclosed, which comprises a semiconductor power switch 33 and a gate drive unit 28, 29 connected to the semiconductor power switch 33 for supplying gate drive signals Vg to the semiconductor power switch 33 to switch it on and off to cause the power converter 6, 7 to generate an alternating current (AC) voltage $V_{AC}$ having a nominal operational frequency f based on command signals 58 received from a controller 31. The gate drive unit 28, 29 is configured to receive command signals 58 based on the AC voltage $V_{AC}$ of the nominal operational frequency f to be generated and to alter the switching events of the semiconductor power switch 33 by addition of a pre-defined jitter-like deviation to the gate drive signals Vg such as to cause the power converter 6, 7 to generate an AC voltage $V_{AC}$* having a modified operational frequency f* which at least partly and temporarily deviates from the nominal operational frequency f by at least a pre-defined minimum percentage. This prevents the power switch apparatus 21 from being misused for military and other undesired applications which it was originally not designed for and which require high frequency generation with high accuracy. A power converter 6, 7 comprising such a power switch apparatus 21 is also disclosed.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power switch apparatus for a power converter comprising:
    a semiconductor power switch; and
    a gate drive unit connected to the semiconductor power switch for supplying gate drive signals to the semiconductor power switch to switch it on and off to cause the power converter to generate an alternating current voltage having a nominal operational frequency based on command signals received from a controller;
    wherein the gate drive unit is configured to receive command signals based on the AC voltage of the nominal operational frequency to be generated and to alter the switching events of the semiconductor power switch by addition of a deviation to the gate drive signals such as to cause the power converter to generate an AC voltage having a modified operational frequency which at least partly and temporarily deviates from the nominal operational frequency by at least a pre-defined minimum percentage.

2. The power switch apparatus according to claim 1, wherein the deviation is based on random selection of switching event alteration or based on deterministic patterns applied using complex algorithms.

3. The power switch apparatus according to claim 1, wherein the semiconductor power switch is of a type selected from an insulated gate bipolar transistor, a bi-mode isolated gate power transistor, a metal-oxide-semiconductor field-effect transistor, a junction gate field-effect transistor, an integrated gate-commutated thyristor or a gate turn-off thyristor and comprising a control terminal connected to the gate drive unit for receiving the gate drive signals therefrom.

4. The power switch apparatus according to claim 1, wherein the gate drive unit is configured to alter the switching events only if the operational frequency of the AC voltage to be generated is equal to or higher than a minimum pre-defined frequency threshold.

5. The power switch apparatus according to claim 4, wherein the minimum pre-defined frequency threshold is about 600 Hz.

6. The power switch apparatus according to claim 4, wherein the gate drive unit is configured to obtain nominal operational frequency information, recognize when the nominal operational frequency obtained is equal to or higher than the minimum pre-defined frequency threshold, and start altering the switching events as a result of this recognition.

7. The power switch apparatus according to claim 1, wherein the pre-defined minimum percentage defines a stability tolerance range for the frequency of the generated AC voltage as desired or requested by a specific application.

8. The power switch apparatus according to claim 6, wherein the pre-defined minimum percentage is about 0.2%.

9. The power switch apparatus according to claim 1, wherein the generated AC voltage is the output voltage of an AC to AC converter or a DC to AC inverter or an internal voltage of an intermediate AC stage of a DC to DC converter.

10. The power switch apparatus according to claim 1, wherein the gate drive unit is configured to alter the switching events by introducing a time-varying jitter-like component, preferably a random jitter-like component, to the timing of the gate drive signals such as to provide a time-varying modified operational frequency or frequency component of the generated AC voltage.

11. The power switch apparatus according to claim 1, wherein the gate drive unit is configured to alter the switching events by changing the timing of the gate drive signals such as to provide a constant modified operational frequency or frequency component of the generated AC voltage which deviates from the nominal operational frequency (f) by at least the pre-defined minimum percentage.

12. The power switch apparatus according to claim 1, wherein the gate drive unit contains an integrated circuit device, preferably a System on Chip FPGA device comprising a microcontroller, a flash-based FPGA fabric having a multitude of programmable logic elements, a nonvolatile memory device for data and code storage, and I/O peripheral interfaces.

13. The power switch apparatus according to claim 1, wherein the gate drive unit includes integrated security features to provide information security of configuration data, to protect the access to memories and to provide anti-counterfeiting and anti-tamper protection.

14. The power switch apparatus according to claim 1, wherein the gate drive unit is arranged to communicate with the controller using an encrypted communication protocol.

15. The power switch apparatus according to claim 1, wherein the gate drive unit is arranged to operate and cooperate with the controller only if it receives a valid passcode from the controller and otherwise cease operation and avoid supplying gate drive signals to the semiconductor power switch.

16. A power converter, comprising:
a controller for controlling operation of the power converter;
a plurality of semiconductor power switches;
a plurality of gate drive units in communication with the controller for receiving command signals therefrom and connected to supply gate drive signals to the plurality of semiconductor power switches to switch them on and off to cause the power converter to generate an alternating current voltage having a nominal operational frequency based on the command signals received from the controller;
wherein at least one of the plurality of gate drive units is configured to receive a command signal based on the AC voltage of the nominal operational frequency to be generated and to alter the switching events of the corresponding semiconductor power switch by addition of a deviation to the gate drive signals such as to cause the power converter to generate an AC voltage having a modified operational frequency which at least partly and temporarily deviates from the nominal operational frequency by at least a pre-defined minimum percentage.

17. The power switch apparatus according to claim 16, wherein the at least one gate drive unit is configured to alter the switching events only if the operational frequency of the AC voltage to be generated is equal to or higher than a minimum pre-defined frequency threshold.

18. The power switch apparatus according to claim 16, wherein the power converter is an AC to AC converter or a DC to AC inverter and the generated AC voltage is the output voltage of the power converter or wherein the power converter is a DC to DC converter and the generated AC voltage is an internal voltage of an intermediate AC stage of the DC to DC converter.

19. The power switch apparatus according to claim 16, wherein the at least one gate drive unit is configured to alter the switching events by introducing a time-varying jitter-like component, preferably a random jitter-like component, to the timing of the gate drive signals such as to provide a time-varying modified operational frequency of the generated AC voltage.

20. The power switch apparatus according to claim 16, wherein the at least one gate drive unit and the controller are configured to communicate with each other using an encrypted communication protocol and to operate and cooperate with each other only if they exchange a valid passcode, wherein otherwise the gate drive unit is configured to avoid supplying gate drive signals to the corresponding semiconductor power switch.

* * * * *